United States Patent
Chhagan et al.

(10) Patent No.: US 6,277,716 B1
(45) Date of Patent: Aug. 21, 2001

(54) METHOD OF REDUCE GATE OXIDE DAMAGE BY USING A MULTI-STEP ETCH PROCESS WITH A PREDICTABLE PREMATURE ENDPOINT SYSTEM

(75) Inventors: Vijaikumar Chhagan, Leicester (GB); Yelehanka R. Pradeep; Tjin Tjin Tjoa, both of Singapore (SG)

(73) Assignee: Chartered Semiconductor Manufacturing Ltd. (SG)

( * ) Notice: Subject to any disclaimer, the term of this patent is extended or adjusted under 35 U.S.C. 154(b) by 0 days.

(21) Appl. No.: 09/425,908

(22) Filed: Oct. 25, 1999

(51) Int. Cl.$^7$ .................................. H01L 21/4763

(52) U.S. Cl. .............. 438/584; 438/634; 438/689; 438/735; 438/737; 438/740

(58) Field of Search ................... 438/584, 585, 438/253, 216

(56) References Cited

U.S. PATENT DOCUMENTS

| | | | |
|---|---|---|---|
| 4,447,290 | 5/1984 | Matthews | 156/626 |
| 5,188,980 | 2/1993 | Lai | 437/193 |
| 5,453,156 | 9/1995 | Cher et al. | 156/643.1 |
| 5,500,076 | 3/1996 | Jerbic | 156/636.1 |
| 5,739,051 | 4/1998 | Saito | 438/16 |
| 5,747,380 | 5/1998 | Yu et al. | 438/599 |
| 5,789,294 | 8/1998 | Choi | 438/258 |
| 5,843,835 | * 12/1998 | Liu | 438/585 |
| 6,083,815 | * 7/2000 | Tsai et al. | 438/585 |

* cited by examiner

Primary Examiner—Vu A. Le
Assistant Examiner—Beth E. Owens
(74) Attorney, Agent, or Firm—Stephen B. Ackerman; Rosemary L. S. Pike; William J. Stoffel

(57) ABSTRACT

A method of fabricating a gate stack having an endpoint detect layer and a multi-step etch process to prevent damage to a gate dielectric layer. The special endpoint detect layer emits an endpoint signal that allows the etch chemistry to be changed to a more selective polysilicon to oxide ratio to prevent damage to the gate oxide layer. The invention begins by forming a gate dielectric layer over a substrate. We then form an endpoint detect layer over the gate dielectric layer. A gate stack is formed over the bottom silicon layer. Then a mask is formed over the gate stack. The mask defines a gate electrode. We etch the gate stack and the endpoint detect layer using a multi-step etch comprising at least 3 steps. In a main etch step, the gate stack and the endpoint detect layer are etched using a first etch chemistry. Upon an endpoint detection signal generated by etching the gate stack, the first etch step is stopped. In an endpoint detect layer etch step, the gate stack layer and the endpoint detect layer are etched using a second etch chemistry. The endpoint etch step is stopped when an endpoint detect signal changes upon reaching the gate dielectric layer. The second etch chemistry has a higher selectivity from the gate dielectric layer to the gate stack layer and endpoint detect layer than the first etch chemistry. In an overetch step, using a third etch chemistry with a higher selectivity than the second etch chemistry, we etch the endpoint detect layer without damaging the gate dielectric layer.

15 Claims, 3 Drawing Sheets

METHOD OF REDUCE GATE OXIDE DAMAGE BY USING A MULTI-STEP ETCH PROCESS WITH A PREDICTABLE PREMATURE ENDPOINT SYSTEM

BACKGROUND OF INVENTION

1) Field of the Invention

This invention relates generally to fabrication of semiconductor devices and more particularly to a method for etching a polysilicon gate and gate oxide stack that reduces gate oxide damage by using a multi-step etch process using a special end point detection (e.g., nitrided) Silicon layer to create an early endpoint trace.

2) Description of the Prior Art

Plasma etch processes and apparatus are generally well known for etching materials for semiconductor device fabrication. The process begins with an application of a masking material, such as photoresist, to a silicon wafer. The masking pattern protects an area of the wafer from the etch process. The wafer is then placed in a plasma reactor (i.e., etcher) and etched. Subsequent steps are determined by the type of device being fabricated.

A common silicon etch process is based on fluorine. When mixtures such as $CF_4$ &$O_2$ are dissociated in an electrical discharge, fluorine atoms are liberated and volatilize the silicon as $SiF_4$. Nevertheless, these processes are isotropic, i.e., they etch in all directions at the same rate. Moreover, anisotropic or vertical etches in silicon are not observed when fluorine is the sole etchant.

For vertical (anisotropic) etches of silicon, the use of gas mixtures, such as $C_2F_6$ & $Cl_2$, is known. The $C_2F_6$ serves as a source of "recombinants", such as $C_3$. The recombinants suppress lateral etching (in the horizontal direction) by recombining with Cl atoms which have been adsorbed on the etched polysilicon sidewalls. Etching can proceed in the vertical direction (perpendicular to the wafer surface) because ion bombardment from the plasma suppresses the recombination mechanism.

Further, the selectivity of etchant between polysilicon and an underlying gate oxide (poly:oxide selectivity) must be as high as possible to minimize oxide loss.

Conventionally, instrumental analysis methods such as mass spectrometry and spectroscopic analysis are used to detect the end point of etching processes. The spectroscopic analysis is relatively simple and highly sensitive. With spectroscopic analysis, a specific active species is selected from radicals, ions, decomposed and reacted products of the etching gas Light strengths of the emission spectrum of this selected active species are measured. The active species selected depends upon the kind of etching gas. When etching gas of the fluorocarbon series such as $CF_4$ is used to etch silicon oxide film, the spectrum (specifically wavelengths 219 nm, 483.5 nm or others) emitted from the reacted product CO* is measured. When the fluorocarbon series etching gas such as $CF_4$ is used to etch silicon nitride film, the spectrum (specifically wavelengths 674 nm or others) emitted from the reacted product N* is measured. The end point of an etching process is decided by comparing changing values, which represents the light strength of the above-mentioned active species having a specific wavelength and primary and secondary differential ones of these light strength values, with a threshold value previously set.

In addition to an etch step, most conventional processes include an overetch step. Overetching is necessary in order to ensure that no residues are left on the wafer. If etching was stopped at the "end point", as determined by optical emission from the plasma, only parts of the wafer would be completely etched while other parts would still be covered with remaining polysilicon. This is due to non-uniformity of both the initial polysilicon film thickness and the etch rate. Moreover, most of the current polysilicon dry processes use an overetch gas.

Recent advances have required that the gate oxide thickness be below 30 Å, forcing the endpoint process to improve selectivity to ensure that there is no damage to the gate oxide and substrate surface. The inventor's current methodology to overcome this is to have a timed etch for about 80% of the polysilicon (stack) thickness. Then change to a more selective etch chemistry to endpoint. The disadvantages of this are that if there are variations in the stack (e.g.,. polysilicon) thickness or in the characteristics of the etch machine drift, the % poly stack etch would vary thus making the triggering of endpoint unstable and unrepeatable.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 4,447,290(Matthews), U.S. Pat. No. 5,188,980(Lai), U.S. Pat. No. 5,789,294(Choi) and U.S. Pat. No. 5,453,156(Cher et al.) show gate stack etch processes.

U.S. Pat. No. 5,747,380(Yu et al.), U.S. Pat. No. 5,739,051(Saito), and U.S. Pat. No. 5,500,076(Jerbic) show etch processes with endpoint detecting.

However, an improved process/gate stack structure is needed to reduce etch damage to the thinner gate dielectric layers.

SUMMARY OF THE INVENTION

It is an object of the present invention to provide an etch method and polysilicon gate stack structure that allow for an accurate stack etch and minimal damage to the gate oxide layer.

It is an object of the present invention to provide a multi-step etch method and polysilicon gate stack structure having a special endpoint detect layer that allow for an accurate stack etch and minimal damage to the gate oxide layer.

It is an object of the present invention to provide a multi-step etch method and polysilicon gate stack structure where the stack is used as a dopant stop layer.

To accomplish the above objectives, the present invention provides a method of fabricating a gate stack having a special endpoint detection layer that emits an endpoint detection signal before the polysilicon is etched down to the underlying gate dielectric. The invention also has a multi-step etch process which has higher selectivity etch steps as the etch proceeds down to near the gate dielectric layer to prevent damage to the gate dielectric layer. Also, the endpoint detect layer can be used as a dopant stop layer to prevent dopants from diffusing from the gate stack to the gate dielectric.

The invention begins by forming a gate dielectric layer over a substrate. We then form an endpoint detect layer over the gate dielectric layer. A gate stack is formed over the bottom silicon layer. Then a mask is formed over the gate stack. The mask defines a gate electrode.

We etch the gate stack and the endpoint detect layer using multi-step etch comprising preferably 3 steps. In a main etch step, the gate stack and the endpoint detect layer are etched using a first etch chemistry. Upon an endpoint detection signal generated by etching the gate stack, the first etch step is stopped.

In an endpoint etch step, using a second etch chemistry, we etch the gate stack layer and the endpoint detect layer stopping the endpoint etch step when an endpoint detect signal changes upon reaching the gate dielectric layer. The second etch chemistry having a higher selectivity from the gate dielectric layer to the gate stack layer and endpoint detect layer than the first etch chemistry.

In an overetch step, using a third etch chemistry, we etch the endpoint detect layer without damaging the gate dielectric layer.

The invention's special endpoint detect layer emits an endpoint signal that allows the etch chemistry to be changed to a more selective polysilicon (or gate stack) to oxide (gate dielectric) ratio to prevent damage to the gate oxide layer.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge.

Silicon, as used in this application, includes crystalline silicon, polysilicon (polycrystalline silicon), amorphous silicon (non-crystalline silicon), monocrystalline silicon and silicon/germanium materials. Such silicon may be n- or p-doped, or undoped.

CVD refers to chemical vapor deposition. LPCVD refers to low pressure chemical vapor deposition. Ion implantation refers to the implantation of ions, for example, for doping a semiconductor substrate. Salicidation means formation of self-aligned silicide.

Electronic element refers to active electronic devices and passive component parts. Electrical conductor refers to a material which readily conducts electricity and includes metals, p-type material (semiconductor material that has been doped with an acceptor-type impurity and conducts current via hole migration), and n-type material (semiconductor material that has been doped with a donor-type impurity and conducts a current via electrons).

Oxide as used in the subject invention refers to silicon oxides. Nitride as used herein refers to silicon nitride. The oxide may be doped or undoped, such as PSG (phosphosilicate glass) or BPSG (Boron doped PSG). An insulation layer or insulator layer refers to a layer having a high resistivity, which does not conduct electricity. It may act as a sodium barrier. For the purposes of the present invention, the insulation layer must be capable of being selectively etched to nitride.

The invention provides a method of fabricating a gate stack having a special endpoint detect layer and a multi-step etch process to prevent damage to a gate dielectric layer. The endpoint detect layer 16 changes the signal to indicate when the etch has started etching the end point detect layer 16.

A. Form Gate Dielectric Layer 14 Over a Substrate 10

Figure 1:
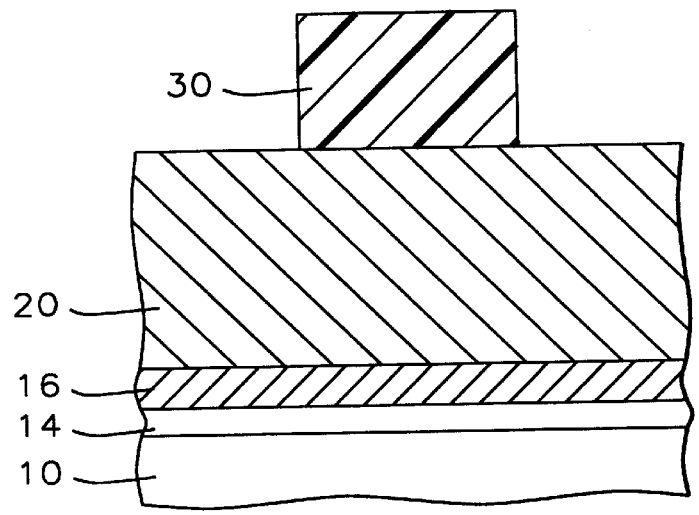
FIGS. 1 and 2 are cross sectional views for illustrating a method for etching a gate stack according to the present invention.

FIG. 1 shows the step of forming a gate dielectric layer 14 over a substrate 10. The gate dielectric is preferably a thermal oxide layer having a thickness between 20 and 80 Å and more preferably between 20 and 30 Å and most preferably below 30 Å. The gate dielectric layer can comprise oxynitride, oxide, $Ta_2O_5$, or silicon nitride and most preferably is an oxide layer.

B. Form an Endpoint Detect Layer 16 Over the Gate Dielectric Layer 14

Next, we form an endpoint detect layer 16 over the gate dielectric layer 14. The endpoint detect layer 16 is comprised of polysilicon and a material that is capable of being detected (e.g., by a photo diode, laser interferometry or other spectrum detecting device used to monitor etch progress) during the subsequent etch process. Possible endpoint detection systems include: laser interferometry, Optical Emission Spectroscopy, mass spectroscopy, langmuir probe, self-bias variation or pressure based endpoint detection.

The endpoint detect layer 16 is preferably comprised of nitrogen rich Silicon (e.g., nitrogen rich polysilicon, or nitrided rich silicon) having a Nitrogen molar concentration between 2% and 50% and (or $Si_xN_y$ where x is between 1 and 3) and Y is between 1 and 3; and a thickness of between about 20 and 200 Å.

Other Endpoint Species

The endpoint detect layer, in addition to N containing Si layer or silicon nitride (SiN), can comprise oxygen, Germanium or combination containing Si layer which also can be detected by the endpoint detector, spectroscopy or photodetector.

Endpoint Layer Formed by $NH_3$ Atmosphere

The endpoint detecting nitrogen rich silicon layer can be formed by an LPCVD process with a silicon source (such as $SiH_4$, $SiCl_2H_2$) in a N containing environment (e.g., $NH_3$, $N_2O$).

Endpoint detect layer can be formed in a $NH_3$, $N_2O$, NO or $O_2$ atmosphere. The endpoint detecting silicon layer can be formed by LPCVD process with a silicon source, such as $SiH_4$, $SiCl_2H_2$, in a $N_2O$ /$NO$/$O_2$ containing environment.

The nitrogen rich layer can have a higher concentration of N in the top or bottom portions. For example, the N source ($N_2$, $N_2O$ or NO) in a LPCVD process could be turned on in the beginning (e.g., first 10% of the dep time) of the detect layer deposition and turned off This way the detect layer has a higher N content at the bottom. Likewise, the N source could be turned on toward the middle or end (e.g., last 10% of the dep time) of the deposition to have a high N content at the top of the detect layer.

Endpoint Detect Layer Formed by I/I

The endpoint detecting silicon layer comprising a nitrogen rich silicon layer is formed by depositing a polysilicon layer and implanting N-ions into the polysilicon layer. For example, a polysilicon layer can be formed over the gate dielectric. The poly (polysilicon) layer can have thickness of between about 50 and 250 Å. Next, the poly layer is I/I with $N_2$ ions to form the endpoint detect layer 16 and the remaining overlying poly layer forms the gate stack layer 20. The $N_2$ I/I preferably has the following parameters: dose between about 1E13 per $cm^2$ to 1E14 per $cm^2$, and energy between 5 and 30 KeV.

C. Form a Gate Stack 20 Over the Bottom Silicon Layer 14

Next, we form a gate stack layer 20 over the bottom silicon layer 14. The gate stack layer 20 can be composed of one polysilicon layer or several layers. Many combinations of layers are possible in the gate stack.

In a preferred embodiment the gate stack 20 comprises a polysilicon layer, and overlying W-silicide layer. The poly layer preferably has a thickness of between about 500 and 3000 Å and the W silicide layer preferably has a thickness of between about 300 and 3000 Å.

D. Form a Mask Over the Gate Stack

Next, we form a mask 30 over the gate stack. The mask 30 defines a gate electrode. The mask can be a photoresist layer that is exposed and developed using conventional methods to form a pattern over the areas where gate electrodes are to be formed and openings where the gate stack is to be removed.

The mask can also be a multi-layered structure such as a photoresist layer with an underlying bottom anti-reflective coating (BARC) layer, (such as an inorganic, or organic, layer) and/or a hard mask layer such as a silicon nitride or silicon oxide layer.

The mask layer preferably comprises an underlying BARC layer and an overlying photoresist layer. The BARC layer is preferably composed of organic materials.

Figure 2:
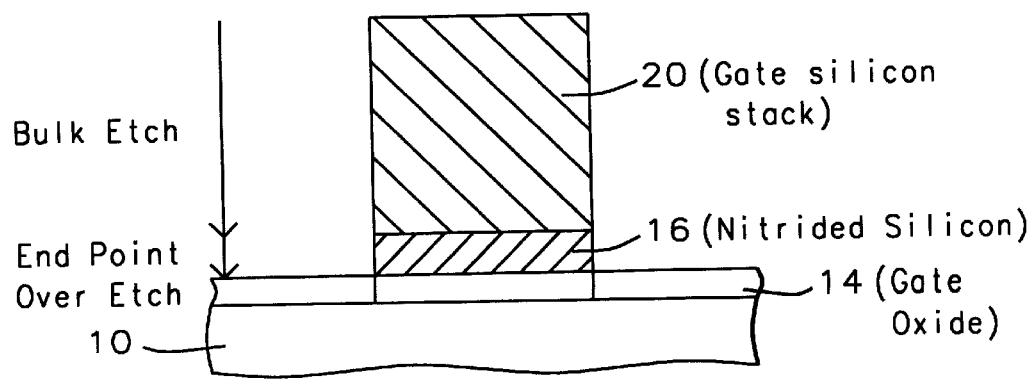

E. Etch the Gate Stack 20 and the Endpoint Detect Layer 16 using Multi-step Etch Next, as shown in FIG. 2, the gate stack 20 and the endpoint detect layer 16 are etched using multi-step etch process.

The etch is preferably performed in a reactive ion etch etcher. The reactive ion etch etcher preferably has photodiode detectors that monitor the progress of the etches and by observing/recording the changes in the emissions, determine the end point of the etch. The etch monitor or end point detection system can be (but not limited to) Optical emission Spectroscopy, laser Interferometry or self bias change or pressure based endpoint detection or combinations of these.

Figure 3:
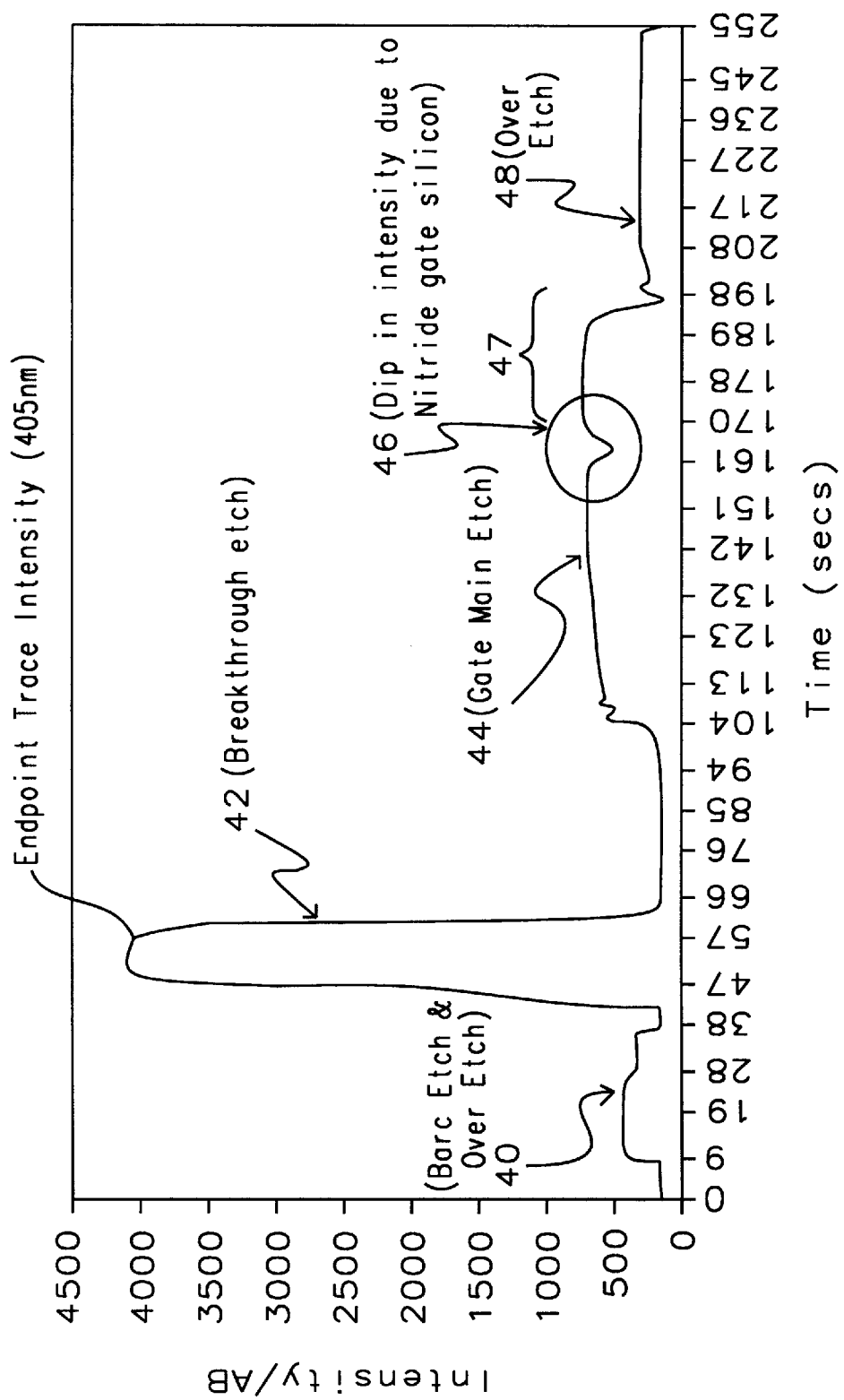
FIG. 3 is an etch detector graph showing a trace of a gate stack etch having a etch detector silicon layer according to a preferred embodiment of the present invention.

The etch process preferably has at least 2 steps—a gate stack main etch (first step) (e.g., 44 as shown in FIG. 3), that etches the gate stack 20 and an overetch step (e.g., 48 as shown in FIG. 3) that removes the remaining gate stack. It is very important that the etch process (either main etch step, endpoint detection step, or overetch step) does not damage the gate oxide layer 14. If the gate oxide layer is damaged, the polysilicon gate stack etch will etch pits into the Si substrate 10.

F. Main Gate Stack Etch Step:

In a main gate stack etch step (or Bulk etch step), using a first etch chemistry, we etch the gate stack 20 and the endpoint detect layer 16. The first etch step is stopped when an endpoint detection light signal is detected from the etch of endpoint detect layer 16.

Light strengths are obtained by detecting the emission spectrum of an active species by a detector means or photodetector means. For example, in optical emission spectroscopy, the etch of a specific object (e.g., gate stack layer) gives off a specific specific wavelength of light that is analyzed.

For example, in the Bulk etch step 44, the SiF activated species gives off a light at a wavelength of about 405 nm (+/−20 nm) at a certain intensity. The photodetector in the etch tool measures light intensity and other instruments record and analyze the data.

Referring to FIG. 3, the section 44 of the end point trace shows the trace during the main etch or bulk etch. The bulk etch typically has a low Si to $SiO_2$ selectivity that allows the polysilicon to be etched fast.

As the etch proceeds and the endpoint detect layer 16 is etched, the end point signal lowers in intensity (see section 46). This is because the nitride (SiN) (or other species) in the gate reduces the amount of Si that reacts with F* radicals and reduces the amount of light that is given off.

G. Endpoint Detect Layer Etch Step

When this lowered intensity end point 46 is detected the Bulk etch is stopped and the endpoint etch is started. The endpoint etch step has a different chemistry than the main etch step. The endpoint etch step has a medium selectivity between Si and $SiO_2$. This contrasts with the main etch step that has a low selectivity gate stack to gate dielectric layer.

Referring to FIG. 3, after the dip (section 46) in the end point trace, the Bulk etch is stopped, and the overetch step is started.

H. Overetch Step

In the overetch step; (see FIG. 3, section 48) using a second etch chemistry, the remaining gate stack and remaining endpoint detect layer 16 are etched without damaging the gate dielectric layer 14. The overetch step has a new chemistry that has a high selectivity of Si to $SiO_2$ to protect the gate dielectric layer 14.

In the description above, if additional layers are formed in the gate stack 20 then additional etch steps can be added to the etch process to etch the additional layers. The multi-step etch above below etches the gate stack layer 20 (e.g., polysilicon), and the end point detect layer 16. If other layers are included in the gate stack layer 20 (e.g., $WSi_x$) or layers are formed above the gate stack, additional etch steps can be added.

EXAMPLES

The following non-limiting examples represent preferred forms and best modes contemplated by the inventor for practice of this invention, as well as illustrating the results obtained through its use.

Figure 4:
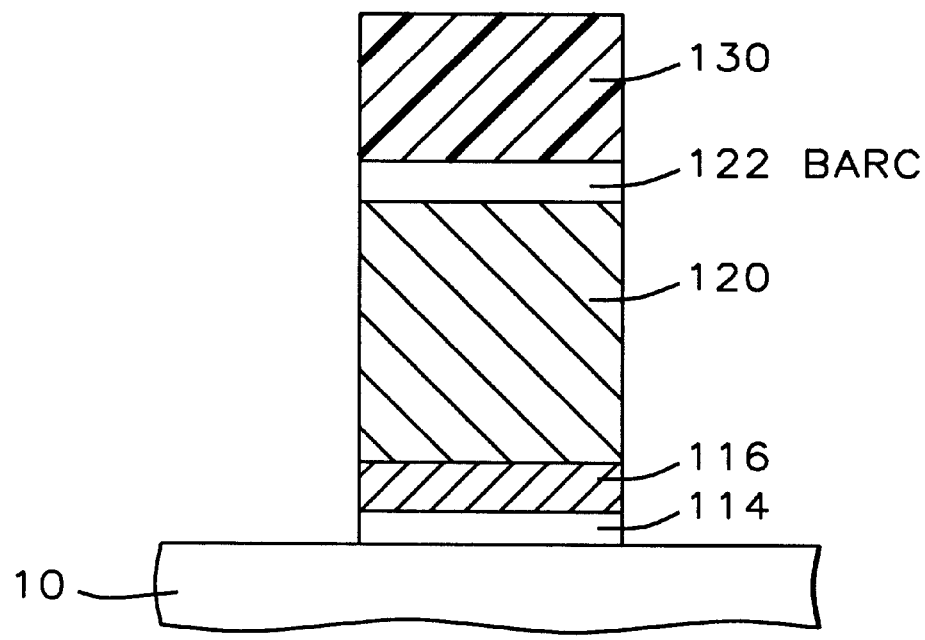
FIG. 4 is cross sectional view for illustrating a preferred embodiment of the method for etching a gate stack according to the present invention.

Below an example is described that describes a way that the invention can be implemented. FIG. 3 shows the endpoint trace for this example. FIG. 4 shows a cross sectional view of the gate electrode comprising: substrate 10, gate dielectric layer 114, end point detect layer 116, bottom anti-reflective coating (BARC) layer 122 and photoresist layer 130.

Table 1 describes a possible composition of gate electrode layers.

TABLE 1

Layers of Gate Electrode

| Layer | Material | Thickness range (low–high) |
|---|---|---|
| gate dielectric 114 | silicon oxide | 20–200Å |
| endpoint detect layer 116 | nitrogen rich silicon (e.g., SiN) | 20–200 |
| gate stack 120 | polysilicon | 500–3500Å |
| bottom anti-reflective coating (BARC) 122 | | 300–2500Å |
| photo resist 130 | | 4000–20,000Å |

Table 2 below shows a preferred multi-step etch process.

TABLE 2

Multi-step Etch Process

| Etch Steps | Selectivity of Si vs SiO$_2$ | Preferred Etch Chemistry | Etch Chemistry (gas composition and pressure). |
|---|---|---|---|
| BARC etch & BARC overetch 40 | selectivity to gate electrode > 5:1 | pressure about 10 mTorr (5 to 13 mTorr) HBr/O$_2$ | 5–30 mTorr prossure, Cl$_2$/O$_2$ or CF$_4$/O$_2$/ HBr or O$_2$/N$_2$ |
| Breakthru Etch 42 | selectivity Si to SiO$_2$ tgt = 1:2 | pressure about 10 mTorr (5 to 13 mTorr) CF$_4$ | CF$_4$, or C$_2$F$_6$ or Cl$_2$ |
| Main Etch step 44 (Bulk Etch) | selectivity Si to SiO$_2$ high (>25:1) | Pressure 7 mTorr (5 to 13 mTorr) Cl$_2$/He/O$_2$/HBr | HCl, HBr, Br$_2$, I$_2$, HI |
| endpoint detect layer etch 47 | selectivity Si to Nitride rich layer Medium (About 5:1 = between 3:1 and 7:1)) | Pressure 7 mTorr (5 to 13 mTorr) Cl$_2$/He/O$_2$/HBr | HCl, HBr, Br$_2$, I$_2$, HI |
| Overetch 48 | selectivity Si to SiO$_2$ high (preferably greater than 120:1 and more preferably about 150:1) (between 130:1 and 170:1) | Pressure 80 mTorr He/O$_2$/HBr | |

In this example, the endpoint detect layer 116 is formed of a nitride rich polysilicon layer and formed by depositing polysilicon in an ammonia ambient in an LPCVD process using NH$_3$ $_{/N2}$O gasses. The molar percentage N in the endpoint detect layer is between about 2 and 50% and more preferably between about 10 and 20% thus ensuring enough N to be detected using the photodetector. FIG. 3 shows the endpoint trace for this example. FIG. 3 is a trace taken at a wavelength of about 405 nm.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known processes have not been described in detail in order to not unnecessarily obscure the present invention. Also, the flow rates in the specification can be scaled up or down keeping the same molar % or ratios to accommodate different sized reactors as is known to those skilled in the art.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a gate stack and a etch process to prevent damage to a gate dielectric layer comprising:
   a) forming a gate dielectric layer over a substrate;
   b) forming an endpoint detect layer over said gate dielectric layer;
   c) forming a gate stack over said endpoint detect layer;
   d) forming a mask over said gate stack; said mask defining a gate electrode;
   e) etching said gate stack and said endpoint detect layer using a multi-step etch process comprising:
      (1) in a main etch step: using a first etch chemistry, etching said gate stack and said endpoint detect layer stopping said first etch step when an endpoint detection signal is detected from etching said endpoint detect layer;
      (2) in an endpoint detect layer etch step: using a second etch chemistry, etching said gate stack layer and said endpoint detect layer and stopping said endpoint detect layer etch step when an endpoint detect signal changes upon reaching said gate dielectric layer; said second etch chemistry having a higher selectivity from the gate dielectric layer to the gate stack layer and endpoint detect layer than said first etch chemistry;

(3) in an overetch step: using a third etch chemistry, etching said endpoint detect layer without damaging said gate dielectric layer.

2. The method of claim 1 wherein said endpoint detect layer is comprised of nitrogen rich silicon having a N molar concentration between about 2 and 50% and a thickness of between about 20 and 300 Å.

3. The method of claim 1 wherein said endpoint detect layer comprises a nitrogen rich polysilicon layer formed by depositing polysilicon in an ammonia ambient.

4. The method of claim 1 wherein said endpoint detect layer is formed by implanting a material that is capable of being an endpoint detection material in said multi-step etch process.

5. The method of claim 1 wherein said endpoint detect layer is formed by implanting a material that is capable of being an endpoint detection material in said multi-step etch process; said material is selected from the group consisting of nitrogen, Ar, Xe, Ge and $O_2$.

6. The method of claim 1 wherein said gate stack is comprised of a bottom polysilicon layer and an overlying tungsten silicide layer; said bottom polysilicon layer having a thickness of between about 500 and 2000 Å and said tungsten silicide layer having a thickness of between about 300 and 3000 Å.

7. The method of claim 1 wherein said masking layer comprises a photoresist pattern with an underlying bottom anti-reflective coating (BARC) layer.

8. The method of claim 1 wherein said endpoint detect layer comprising a nitrogen rich polysilicon layer is formed by depositing a polysilicon layer and implanting N ions into said polysilicon layer.

9. The method of claim 1 wherein said main etch step is performed at a pressure between 5 and 13 mTorr and an etch chemistry comprising $Cl_2/He/O_2/HBr$ or HCl, HBr, $Br_2$, $I_2$, or HI, and a etch selectivity of Si to $SiO_2$>25:1;

and said endpoint detect layer etch step is performed at a pressure between 5 and 13 mTorr and with a selectivity of silicon to nitride rich silicon layer between 3:1 and 7:1 and with etch chemistry of $Cl_2/He/O_2/HBr$ of HCl, HBr, $Br_2$, $I_2$, or HI; and said overetch step comprises a selectivity of Si to $SiO_2$ between about 130:1 to 160:1 and is performed at a pressure between 70 and 90 mTorr and with an etch chemistry of $He/O_2/HBr$.

10. A method of fabricating a gate stack and etch process to prevent damage to a gate dielectric layer comprising:
   a) forming a gate dielectric layer over a substrate;
   b) forming an endpoint detect layer over said gate dielectric layer; said endpoint detect layer comprised of nitrogen rich silicon formed by chemical vapor depositing said endpoint detect layer in a N-containing atmosphere;
   c) forming a gate stack over said endpoint detect layer; said gate stack comprising a polysilicon layer and an overlying silicide layer;
   d) forming a mask over said gate stack; said mask defining a gate electrode;
   e) etching said gate stack and said endpoint detect layer using a multi-step etch process comprising:
      (1) in a main etch step: using a first etch chemistry, etching said gate stack and said endpoint detect layer stopping said first etch step when an endpoint detection signal is detected from etching said endpoint detect layer;
      (2) in an endpoint detect layer etch step; using a second etch chemistry, etching said gate stack layer and said endpoint detect layer and stopping said endpoint detect layer etch step when and endpoint detect signal changes upon reaching the gate dielectric layer; said second etch chemistry having a higher selectivity from the gate dielectric layer to the gate stack layer and endpoint detect layer than said first etch chemistry;
      (3) in an overetch step; using a third etch chemistry, etching said endpoint detect layer without damaging said gate dielectric layer.

11. The method of claim 10 wherein said endpoint detect layer is comprised of nitrogen rich silicon having a N molar concentration between about 2 and 50% and a thickness of between about 20 and 300 Å.

12. The method of claim 11 wherein said endpoint detect layer is comprised of a nitride rich polysilicon layer that is formed by depositing polysilicon in an ammonia containing ambient.

13. The method of claim 11 wherein said endpoint detect layer is comprised of an oxygen rich polysilicon layer.

14. The method of claim 11 wherein said endpoint detect layer is comprised of an oxynitride rich polysilicon layer formed by depositing polysilicon in an $N_2O$ containing ambient.

15. The method of claim 11 wherein said main etch step is performed at a pressure between 5 and 13 mTorr and an etch chemistry comprising $Cl_2/He/O_2/HBr$ or HCl, HBr, $Br_2$, $I_2$, or HI, and an etch selectivity of Si to $SiO_2$>25:1;

and said endpoint detect layer etch step is performed at a pressure between 5 and 13 mTorr and with a selectivity of silicon to nitride rich silicon layer between 3:1 and 7:1 and a with a chemistry of $Cl_2/He/O_2/HBr$ HCl, HBr, $Br_2$, $I_2$, or HI; and said overetch step comprises a selectivity of Si to $SiO_2$ between about 130:1 to 160:1 and is performed at a pressure between 70 and 90 mTorr and with a chemistry of $He/O_2/HBr$.

* * * * *